US008698094B1

(12) United States Patent
Sears et al.

(10) Patent No.: US 8,698,094 B1
(45) Date of Patent: Apr. 15, 2014

(54) PERMANENT MAGNET LENS ARRAY

(75) Inventors: Christopher Sears, Fremont, CA (US); Mehran Nasser-Ghodsi, Hamilton, MA (US); Khashayar Shadman, San Rafael, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 12 days.

(21) Appl. No.: 13/187,019

(22) Filed: Jul. 20, 2011

(51) Int. Cl.
*H01J 1/50* (2006.01)
*H01F 7/00* (2006.01)

(52) U.S. Cl.
USPC ............ 250/396 ML; 335/210; 335/296; 335/267; 335/306

(58) Field of Classification Search
USPC ....... 250/396 R–396 ML; 335/210, 296, 298, 335/306
See application file for complete search history.

(56) References Cited

U.S. PATENT DOCUMENTS

| | | | |
|---|---|---|---|
| 6,410,923 B1 * | 6/2002 | Crewe ................. | 250/396 ML |
| 6,525,463 B1 * | 2/2003 | Choi et al. ................ | 313/497 |
| 6,906,607 B1 * | 6/2005 | Weber et al. ............... | 335/303 |
| 7,091,504 B2 | 8/2006 | Wieland et al. | |
| 7,569,834 B1 | 8/2009 | Richardson | |
| 2010/0084566 A1 * | 4/2010 | Kim ..................... | 250/396 ML |

FOREIGN PATENT DOCUMENTS

| | | | | |
|---|---|---|---|---|
| GB | 2304981 A | * | 3/1997 | ............... H01J 3/02 |
| JP | 2006210254 A | | 8/2006 | |
| RU | 2063108 C1 | | 6/1996 | |

OTHER PUBLICATIONS

Khursheed A et al: "Miniature Scanning Electron Microscope Design Based Upon the Use of Permanent Magnets", Proceedings of SHE, SPIE, USA, vol. 3155, Jan. 1, 1997, pp. 175-184, XPOO7909824, ISSN: 0277-786X, DOI: DOI: 10. 1117/12.279395.*
A. Khursheed, Z. Yan, and N. Karuppiah, Permanent Magnet Objective Lenses for Multicolumn Electron-Beam Systems, Review of Scientific Instruments, 72, 2106 (2001), doi: 10.1063/1.1353197, http://dx.doi.org/10.1063/1.1353197, Published by AIP Publishing LLC.

* cited by examiner

*Primary Examiner* — Ramon Barrera
(74) *Attorney, Agent, or Firm* — Suiter Swantz pc llo

(57) ABSTRACT

A permanent magnetic lens array for charged-particle focusing includes a first sheet of soft magnetic material, wherein the first sheet of soft magnetic material includes a plurality of snorkel cone protrusions arranged in an array pattern, wherein each snorkel cone is axially symmetric and includes an opening passing from a first surface of the first sheet of soft magnetic material to a second surface of soft magnetic material, and a plurality of permanent magnetic elements, wherein each permanent magnetic element is axially symmetric and arranged concentrically with a snorkel cone of the first sheet of soft magnetic material, wherein the snorkel cones of the first sheet of soft magnetic material and the plurality of permanent magnetic elements are configured to form a plurality of magnetic lenses, wherein each magnetic lens has a magnetic field with an axial component oriented perpendicular to the first surface of the soft magnetic material.

23 Claims, 15 Drawing Sheets

PERMANENT MAGNET LENS ARRAY

TECHNICAL FIELD

The present invention generally relates to permanent magnetic lenses suitable for charged-particle focusing, and more particularly to a permanent magnet based magnetic lens array suitable for focusing one or more beams of charged-particles.

BACKGROUND

Magnetic lenses consisting of current-carrying coils and an associated magnetic circuit are conventionally implemented as lenses within conventional charged-particle optics system. For example, coil-based magnetic lenses have been utilized as an objective lens within traditional scanning electron microscopy (SEM) system. Conventional magnetic lenses implemented in conventional charged-particle optic systems may impart considerable structural and design limitations on the implementing charged-particle optic system. In this sense, a conventional coil-based magnetic lens may occupy a significant amount of space between a charged-particle source and an associated specimen surface. Moreover, current-carrying coil-based magnetic lenses produce a significant amount of heat within the charged-particle optic system. An additional drawback associated with conventional coil-based magnetic lenses is the difficulty in fabrication of a charged-particle optics system implementing one or more coil-based magnetic lenses. It is therefore advantageous to produce a magnetic lens or lens array which eliminates or reduces the need for coil-based magnetic lenses. The production of an alternative non-coil-based magnetic lens or lens array reduces manufacturing, design, and operational constraints on an implementing charged-particle optic system. Moreover, a simplified and compact magnetic lens array design allows for the implementation of a magnetic lens array in an arrayed charged-particle system, such as an arrayed SEM system. An arrayed charged-particle system may allow circumventing current limits associated with conventional single column charged-particle optic systems, providing for reduced scan time of a given specimen.

SUMMARY

A permanent magnetic lens array for charged-particle focusing is disclosed. In a first aspect, the permanent magnetic lens array may include, but is not limited to, a planar volume of a permanent magnetic material, wherein the planar volume of permanent magnetic material includes a plurality of lens openings distributed across a surface of the planar volume of the permanent magnetic material, wherein each of the lens openings of the planar volume of the permanent magnetic material is axially symmetrical and passes from a first surface to a second surface of the planar volume of permanent magnetic material; and a planar volume of a soft magnetic material, wherein the planar volume of soft magnetic material includes a plurality of lens openings distributed across a surface of the planar volume of the soft magnetic material, wherein each lens opening of the planar volume of soft magnetic material is axially symmetrical and passes from a first surface to a second surface of the planar volume of soft magnetic material, wherein the planar volume of soft magnetic material is operably coupled to a surface of the planar volume of the permanent magnetic material such that at least a portion of the lens openings of the planar volume of permanent magnetic material are substantially aligned with at least a portion of the lens openings of the planar volume of soft magnetic material, wherein the planar volume of permanent magnetic material and the planar volume of soft magnetic material are arranged in a substantially planar monolithic structure, wherein the plurality of lens openings of the volume of permanent magnetic material and the plurality of lens openings of the volume of soft magnetic material are configured to form a plurality of magnetic lenses, wherein each magnetic lens has a magnetic field with at least an axial component oriented substantially perpendicular to the first surface of the planar volume of the permanent magnetic material.

In a further embodiment, the permanent magnetic lens array may include an additional planar volume of a soft magnetic material, wherein the additional planar volume of soft magnetic material includes a plurality of lens openings distributed across a surface of the additional planar volume of the soft magnetic material, wherein each lens opening of the additional planar volume of soft magnetic material is axially symmetrical and passes from a first surface to a second surface of the additional planar volume of soft magnetic material, wherein the additional planar volume of soft magnetic material is operably coupled to a second surface of the planar volume of the permanent magnetic material such that at least a portion of the lens openings of the planar volume of permanent magnetic material are substantially aligned with at least a portion of the lens openings of the planar volume of soft magnetic material and the additional planar volume of soft magnetic material, wherein the planar volume of permanent magnetic material, the planar volume of soft magnetic material, and the planar volume of soft magnetic material are arranged in a substantially planar monolithic structure, wherein the plurality of lens openings of the planar volume of permanent magnetic material, the plurality of lens openings of the planar volume of soft magnetic material, and the plurality of lens openings of the additional planar volume of soft magnetic material are configured to form a plurality of magnetic lenses, wherein each magnetic lens has a magnetic field with at least an axial component.

In a second aspect, the permanent magnetic lens array may include, but is not limited to, a planar volume of a permanent magnetic material, wherein the planar volume of permanent magnetic material includes a plurality of lens openings distributed across a surface of the planar volume of the permanent magnetic material, wherein each of the lens openings of the planar volume of the permanent magnetic material is axially symmetrical and passes from a first surface to a second surface of the planar volume of permanent magnetic material, wherein the plurality of lens openings of the volume of permanent magnetic material are configured to form a plurality of magnetic lenses, wherein each magnetic lens has a magnetic field with at least an axial component oriented substantially perpendicular to the first surface of the planar volume of the permanent magnetic material.

In a third aspect, the permanent magnetic lens array may include, but is not limited to, a first sheet of soft magnetic material, wherein the first sheet of soft magnetic material includes a plurality of snorkel cones, each snorkel cone protruding from a first surface of the soft magnetic material, wherein the plurality of snorkel cones are arranged in an array pattern, wherein each snorkel cone is axially symmetric and includes an opening passing from the first surface of the first sheet of soft magnetic material to a second surface of soft magnetic material; and a plurality of permanent magnetic elements, wherein each permanent magnetic element is axially symmetric and arranged concentrically with a snorkel cone of the first sheet of soft magnetic material, wherein each of the permanent magnetic elements are operably coupled to the first surface of the first sheet of soft magnetic material, wherein the plurality of snorkel cones of the first sheet of soft magnetic material and the plurality of permanent magnetic elements are configured to form a plurality of magnetic lenses, wherein each magnetic lens has a magnetic field with at least an axial component oriented substantially perpendicular to the first surface of the soft magnetic material.

An apparatus for focusing one or more charged-particle beams is disclosed. In one aspect, the permanent magnetic lens array may include, but is not limited to, at least one charged-particle source; a charged-particle optic system including at least one permanent magnetic lens array, wherein the permanent magnetic lens array includes a plurality of magnetic lenses, each magnetic lens configured to focus a charged-particle beam emitted from the at least one charged-particle source, wherein each of the magnetic lenses is axially symmetrical; and at least one detector configured to detect secondary electrons emitted from the surface of the specimen.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIG. 1A through 2F, the magnetic lens arrays 100 and 200 suitable for focusing charged-particles are described in accordance with the present disclosure. The present invention is directed toward a permanent magnetic lens array arranged such that the magnetic flux loops associated with each permanent magnetic lens of the lens array closes locally around each lens. In one aspect, the permanent magnetic lens array of the present invention may include a monolithic axial lens array 100, while in another aspect the permanent magnetic lens array may include a snorkel-cone lens array 200. It is contemplated herein that the magnetic lenses 102 or 202 of the lens arrays 100 or 200 respectively may be utilized as either the primary objective lens or source condenser lens of an arrayed charged-particle optics system (e.g., arrayed SEM). The present invention aids in eliminating the need for magnetic flux bypass elements in the column region of an implementing charged-particle optics system, allowing for increased column density and eliminating a source of high voltage breakdown within the charged-particle optics system. Moreover, the permanent magnetic lens arrays of the present disclosure provide for a simplified fabrication process relative to electromagnetic coil based magnetic lenses, while also allowing for a more compact design than traditional systems. It is further contemplated that the utilization of the permanent magnetic lens of the permanent magnetic lens arrays of the present disclosure may remove a heat source associated with the operation of conventional coil based lenses. Moreover, it is further recognized that the magnetic lens arrays of the present invention are suitable for implementation within an arrayed charged-particle system (e.g., arrayed SEM system). In this manner, the magnetic lens arrays (e.g., 100 or 200) may be utilized to focus charged-particles (e.g., electrons) of an arrayed charged-particle optic system into numerous 'spots' on the surface of a specimen.

Figure 1A:
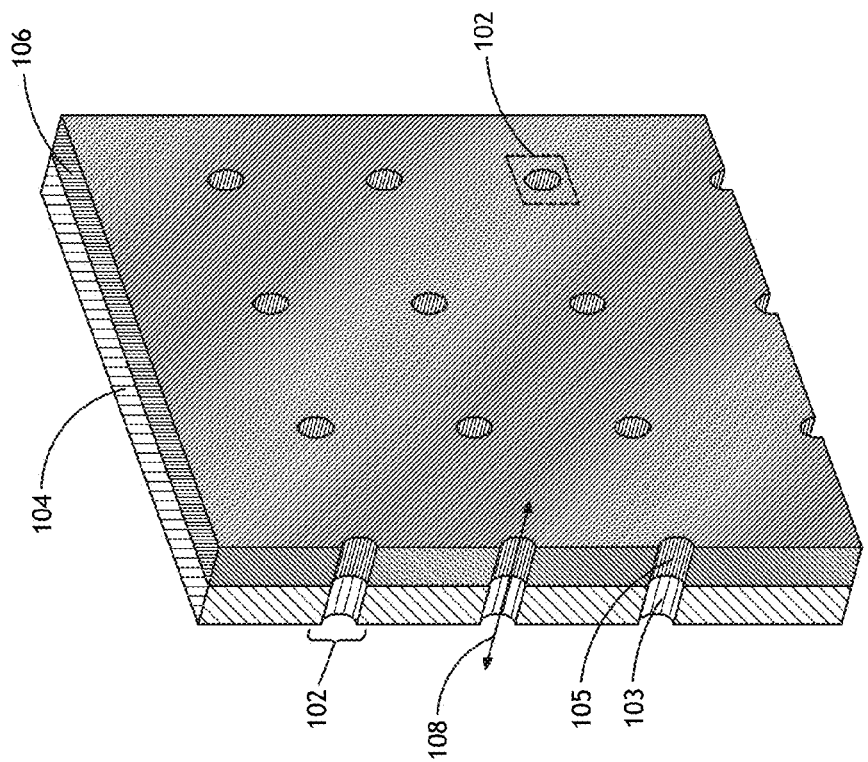
FIG. 1A is a schematic view of a two-layer permanent magnetic axial lens array, in accordance with one embodiment of the present invention.
Figure 1B:
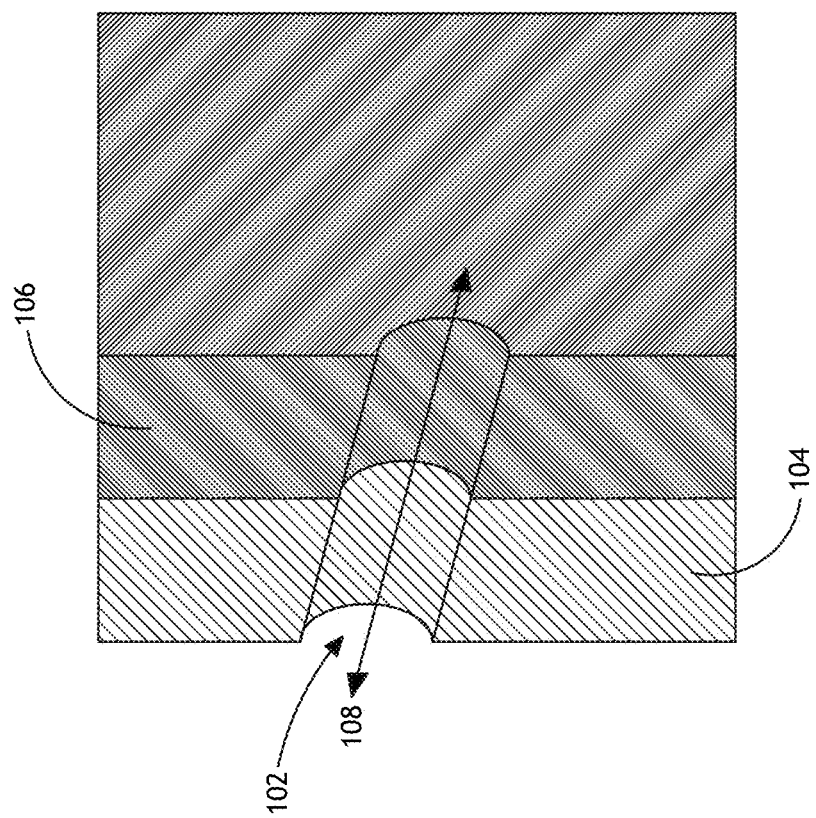
FIG. 1B is an enlarged schematic view of a single axial permanent magnetic lens of an axial lens array, in accordance with one embodiment of the present invention.
Figure 1C:
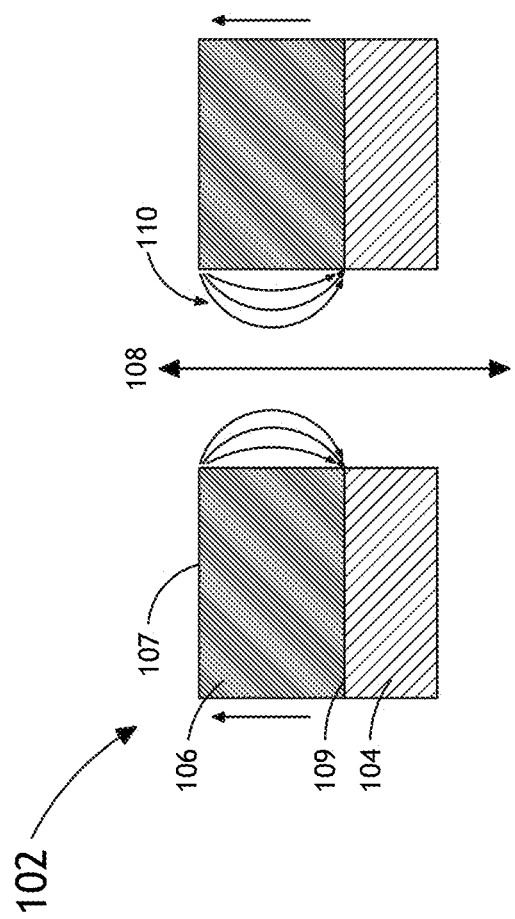
FIG. 1C is an enlarged cross-sectional view of a single axial permanent magnetic lens of an axial lens array, in accordance with one embodiment of the present invention.

FIGS. 1A through 1C illustrate a schematic view of a monolithic axial lens array 100 in accordance with an exemplary embodiment of the present invention. In one aspect, the axial lens array 100 includes a plurality of magnetic lenses 102. In another aspect, the lens array 100 may be formed by operably coupling a sheet of soft magnetic material 104 with a sheet of permanent magnetic material 106. Both the sheet of soft magnetic material 104 and the sheet of permanent magnetic material 106 include a plurality of lens openings 103 and 105, respectively. The sheet of soft magnetic material 104 and the sheet of permanent magnetic material 106 are arranged such that the lens openings 103 and 105 of each are substantially aligned, forming the axial magnetic lenses 102 of the monolithic lens array 100. In this manner, the axial magnetic lenses 102 of the monolithic lens array 100 consist of openings which pass from a 'front' surface of the permanent magnetic sheet 106 to a 'back' surface of the soft magnetic sheet 104, as illustrated in the magnified cross-section view of FIG. 1B.

In a further aspect, the magnetic field of the magnetic lenses 102 of the monolithic lens array 100 has at least an axial component. The sheet of permanent magnetic material 106 may have a net magnetization that is oriented perpendicular to and directed towards the top surface 107 of the permanent magnetic sheet 106, as illustrated in FIG. 1C. In this regard, the permanent magnetic 106 and the soft magnet 104 may be magnetically coupled. In this manner, the alignment of the sheet of soft magnetic material 104 with the sheet of permanent magnetic material 106, creates a magnetic field in each of the magnetic lenses 102 having an axial component 108 directed from the top surface 107 of the permanent magnet sheet 106 to the top surface 109 of the soft magnet sheet 104. It should be recognized by those skilled in the art that in this regard the magnetic field lines 110 associated with each magnetic lens 102 of the lens array 100 close locally with respect to each lens 102, as illustrated in FIG. 1C. Moreover, the field lines 110 of each axial lens 102 of the axial magnetic lens array 100 may remain substantially constrained within the plane of the permanent magnetic sheet 106, with no appreciable field component existing above the plane of the permanent magnetic sheet 106.

In one embodiment, the lens openings of the soft magnetic material 104 (or 112) and the lens openings of the permanent magnetic material 106 may consist of cylindrically shaped lens openings, as depicted in FIGS. 1A and 1B. Consequently, the resultant magnetic lenses 102 created by aligning the openings 103 and 105 may also possess a cylindrical profile. Applicant's notes that the key feature related to choosing cylindrically shaped magnetic lenses 102 includes the axial symmetry of a cylinder. As such, it is contemplated herein that magnetic lenses 102 having different axially symmetric shapes may also be suitable for implementation in the present invention. Thus, the cylindrical shape of the magnetic lenses 102 of the magnetic array 100 should not be interpreted as a limitation but merely as illustrative.

Figure 1D:
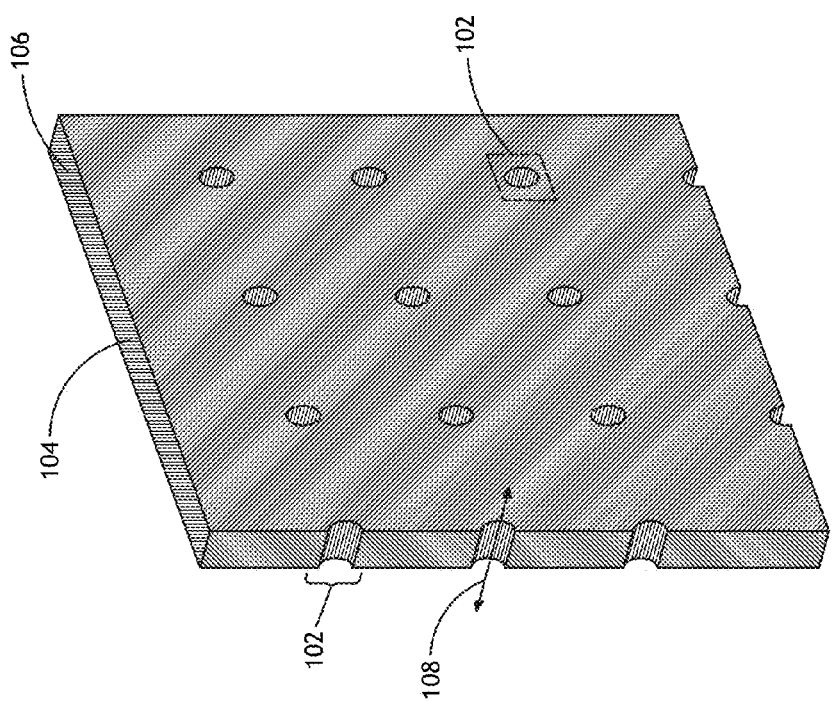
FIG. 1D is a schematic view of a single-layer permanent magnetic axial lens array, in accordance with one embodiment of the present invention.

Referring now to FIG. 1D, an alternative embodiment of the monolithic lens array 112 is illustrated. In the alternative embodiment depicted in FIG. 1D, the monolithic lens array 112 may consist of a single permanent magnetic sheet 106. As in the lens array 100 of FIG. 1A, the axial lens array 112 includes a plurality of magnetic lenses 102. The sheet of permanent magnetic material 106 includes a plurality of lens openings distributed in an array-like pattern distributed across the surface of the permanent magnetic sheet 106. The plurality of lens openings form the axial magnetic lenses 102 of the monolithic lens array 112. In this manner, the axial magnetic lenses 102 of the monolithic lens array 112 may consist of openings which pass from a 'front' surface of the permanent magnetic sheet 106 to a 'back' surface of the permanent magnetic sheet 106.

In a further aspect, as in the bilayer array 100 of FIG. 1A, the magnetic field of the magnetic lenses 102 of the monolithic lens array 100 has at least an axial component directed along the axial direction 108. Further, the sheet of permanent magnetic material 106 may have a net magnetization that is oriented perpendicular to and directed towards the top surface 107 of the permanent magnetic sheet 106.

Figure 1E:
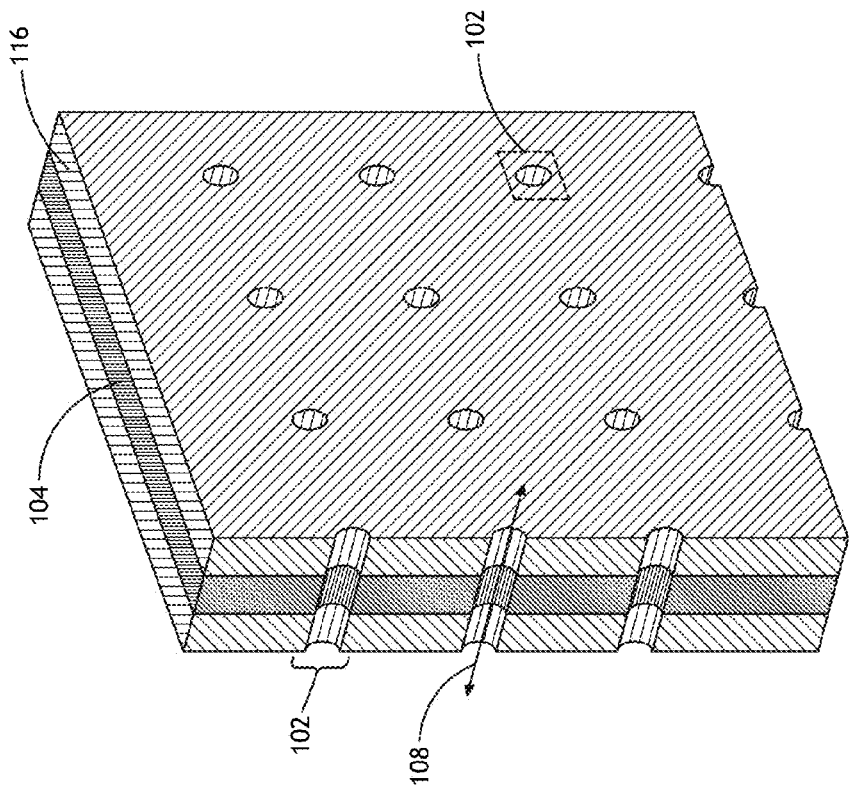
FIG. 1E is a schematic view of a three-layer permanent magnetic axial lens array, in accordance with one embodiment of the present invention.

Referring now to FIG. 1E, an additional alternative embodiment of the monolithic lens array 114 is illustrated. In the alternative embodiment depicted in FIG. 1E, the monolithic lens array 114 may consist of a single permanent magnetic sheet 106 positioned between a first permanent magnetic sheet 106 and a second permanent magnetic sheet 116. In one aspect, the axial lens array 114 includes a plurality of magnetic lenses 102. In another aspect, the lens array 114 may be formed by operably coupling a first sheet of soft magnetic material 104 with a first surface of the sheet of permanent magnetic material 106 and a second sheet of soft magnetic material 116 with a second surface of the sheet of permanent magnetic material 106. The first 104 and second 116 sheets of soft magnetic material and the sheet of permanent magnetic material 106 each include a plurality of lens openings. The sheets of soft magnetic material 104, 116 and the sheet of permanent magnetic material 106 are arranged such that the lens openings of each are substantially aligned, forming the axial magnetic lenses 102 of the monolithic lens array 114. In this manner, the axial magnetic lenses 102 of the monolithic lens array 114 consist of openings which pass from a 'front' surface of the second magnetic sheet 116 to a 'back' surface of the soft magnetic sheet 104, as depicted in FIG. 1E.

In a further aspect, as in the embodiments described previously herein, the magnetic field of the magnetic lenses 102 of the monolithic lens array 114 has at least an axial component. The sheet of permanent magnetic material 106 may have a net magnetization that is oriented perpendicular to and directed towards the top surface 107 of the permanent magnetic sheet 106, as illustrated in FIG. 1C. In this regard, the permanent magnetic 106 and the soft magnet 104 and 116 may be magnetically coupled. In this manner, the alignment of the sheet of soft magnetic sheets 104 and 116 with the sheet of permanent magnetic material 106, creates a magnetic field in each of the magnetic lenses 102 having an axial component 108 directed from the top surface of the permanent magnet sheet 106 to the top surface of the soft magnet sheet 116. It should be recognized by those skilled in the art that in this regard the magnetic field lines (not shown) associated with each magnetic lens 102 of the lens array 114 close locally with respect to each lens 102.

It is further recognized that the soft material sheets 104 and 116 of the previously described embodiments of the axial lens array 100 may act to provide structural rigidity and magnetic field uniformity in the axial lens array 100.

It should be recognized that the descriptive material provided throughout the present disclosure related to the axial lens array 100 should be interpreted to extend to the single layer axial lens array 112 and the three-layer axial lens array 116 of the instant disclosure.

Referring again to FIGS. 1A through 1C, the permanent magnetic material of the permanent magnetic sheet 106 may include, but is not limited to, a ferromagnetic material, such as a rare-earth magnetic material. For example, the permanent magnetic material may include a neodymium-based magnetic material. For instance, the permanent magnetic sheet 106 may be formed from a neodymium-iron-boron (NdFeB) compound, such as, but not limited to, $Nd_2Fe_{14}B$. By way of another example, the permanent magnetic material may include a samarium-based magnetic material. For instance, the permanent magnetic material of the permanent magnetic sheet 106 may be formed from a samarium-cobalt (SmCo) compound, such as, but not limited to, $SmCo_5$ or $Sm_2Co_{17}$. Applicants have found that samarium cobalt grade S2820 manufactured by Dexter Magnetic Technologies is suitable for implementation as the permanent magnetic material of the permanent magnetic sheet 106 of the present invention. It is recognized herein that, while NdFeB based permanent magnetic sheets 106 are advantageous in the sense that NdFeB displays superior magnetic energy-density, SmCo materials generally display a higher Curie temperature than NdFeB based materials. As a result, NdFeB based materials have a lower demagnetization threshold as a function of temperature than SmCo based materials.

Further, since the permanent magnetic material of the permanent magnet sheet 106 provides the magnetic energy required for focusing the charge particles, the permanent magnet material is required to have a large magnetic field. In the case of electrons, a magnetic field between approximately 0.5 and 1.5 Tesla is required for the permanent magnetic material of the permanent magnet sheet 106.

It is further recognized that SmCo based permanent magnetic sheets require manufacturing to a thickness larger than an analogous NdFeB based sheet (due to the lower magnetic energy-density of SmCo) in order to attain the magnetic field of the permanent magnetic sheet 106 required for implementation of the present invention.

It should be recognized by those skilled in the art that sheets of neodymium- or samarium-based permanent magnetic materials (and other like permanent magnetic materials) may be formed by any suitable sintering process known in the art. Upon sintering the ferromagnetic material into a selected sheet, the sheet of ferromagnetic material may be magnetized using a suitable magnetization process using any magnetizer known in the art. Further, upon sintering, a sheet of ferromagnetic material may be machined into the required form. For example, in the case of the array illustrated in FIG. 1A, the sintered piece of permanent magnetic material may be machined into a flat sheet of permanent magnetic material. Moreover, the openings displayed in FIG. 1A may be created by drilling holes through the volume of the permanent magnetic sheet 106 utilizing suitable drilling equipment known in the art.

It is recognized herein that a variety of permanent magnetic materials may be implemented in the context of the present invention. The specific type of permanent magnetic material implemented may depend on a number of factors such as, but not limited, the required Curie temperature, required magnetization, oxidation resistance, fabrication limitations, and the like.

In another embodiment, the soft magnetic material of the soft magnet sheet 104 may include, but is not limited to, magnetic steel. For example, the soft magnetic material may include, but is not limited to, an iron-cobalt based magnetic material. For instance, vanadium permendur, an iron-cobalt alloy consisting of approximately 49.2% iron, 48.8% cobalt, 2% vanadium, and trace levels of other elements (silicon, manganese, and carbon), may be utilized as the soft magnetic material of the soft magnetic sheet 104. Applicants have found that Hiperco50A a brand name version of vanadium permendur, manufactured by Carpenter Technology Corporation, is suitable for implementation as the soft magnetic material in the soft magnetic sheet 104. It is further recognized that Hyperco50A (and like materials) is desirable due to its high magnetic saturation limit of approximately 2.4 Tesla. It is also noted that the material considerations associated with the soft magnet sheet 104 should be considered to apply to the soft magnet sheet 206 and the additional top magnet sheet 212 of the magnet lens array 200 described further herein.

It is recognized herein that the dimensions of the permanent magnet 106 and soft magnet sheets 104, 112 may vary based on the specific requirements of the magnetic lens array 100. For example, the permanent magnet 106 and soft magnet 104, 112 sheets described above may have thicknesses below 1 mm. Further, the axial array 100 may have a total thickness on the order of millimeters. It should be recognized that the above dimensions should not be interpreted as limitations but rather are merely illustrative. A variety of surface areas and thicknesses may be suitable for the permanent magnetic sheet 106 and the soft magnet sheets 104, 112 of the present invention.

Further, it is recognized that magnetic lens array 100 of the present invention may include any number of magnetic lenses 102. For example, the magnetic lens array 100 may include a 5 by 5 array of magnetic lenses 102. In another example, the magnetic lens array 100 may include a 10 by 10 array of magnetic lenses 102. Moreover, the applicant recognizes that the lens array 100 need not be "square" in shape. For example, the lens array 102 may include a 10 by 6 array of lenses 102. Even further, although not shown, it is recognized that the lens array 100 may include additional array shapes including any suitable geometric shape (e.g., hexagon array pattern of lenses 102) or combination of geometric shapes (e.g., concentric rings of lenses 102).

Figure 2A:
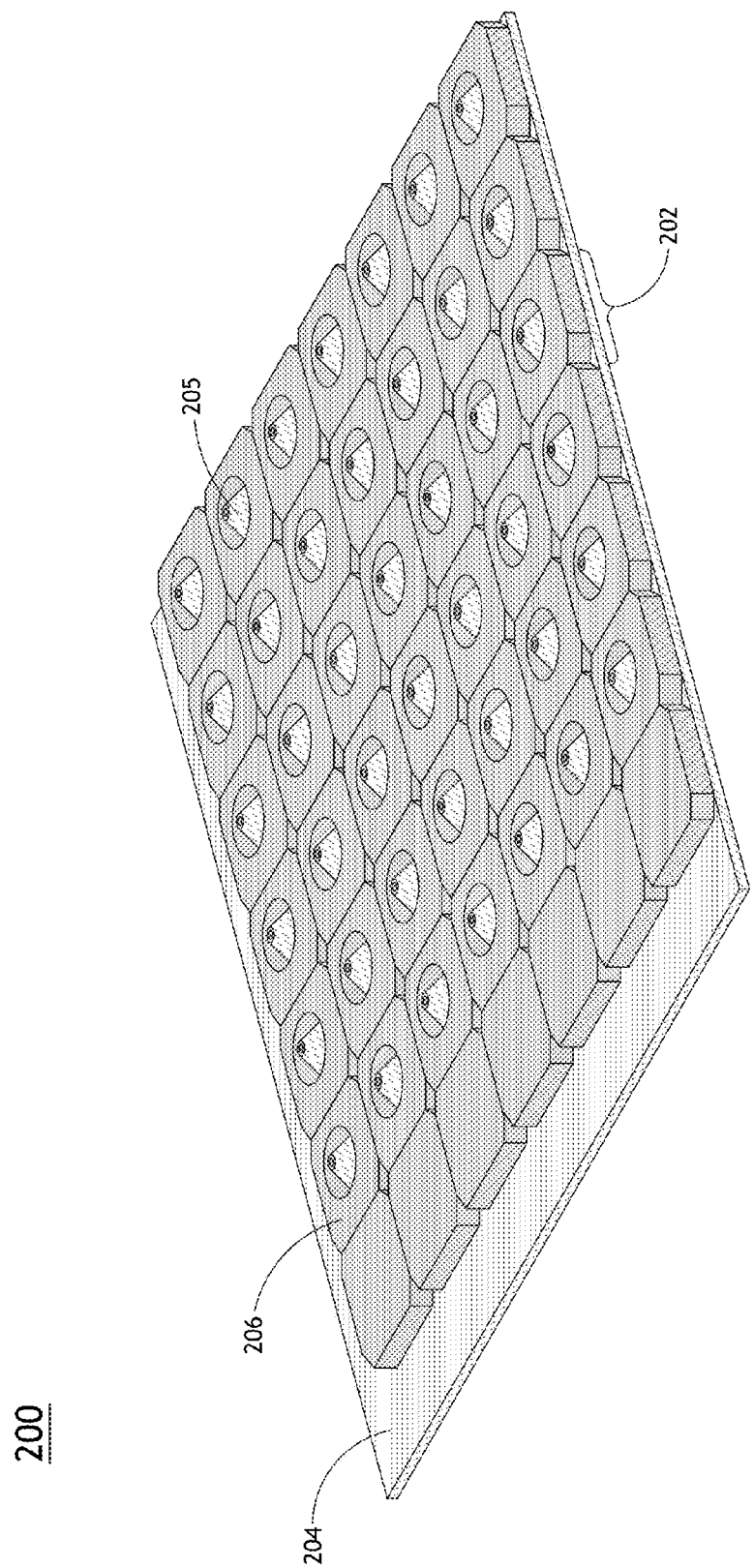
FIG. 2A is a schematic view of a permanent magnetic snorkel-cone lens array, in accordance with one embodiment of the present invention.
Figure 2B:
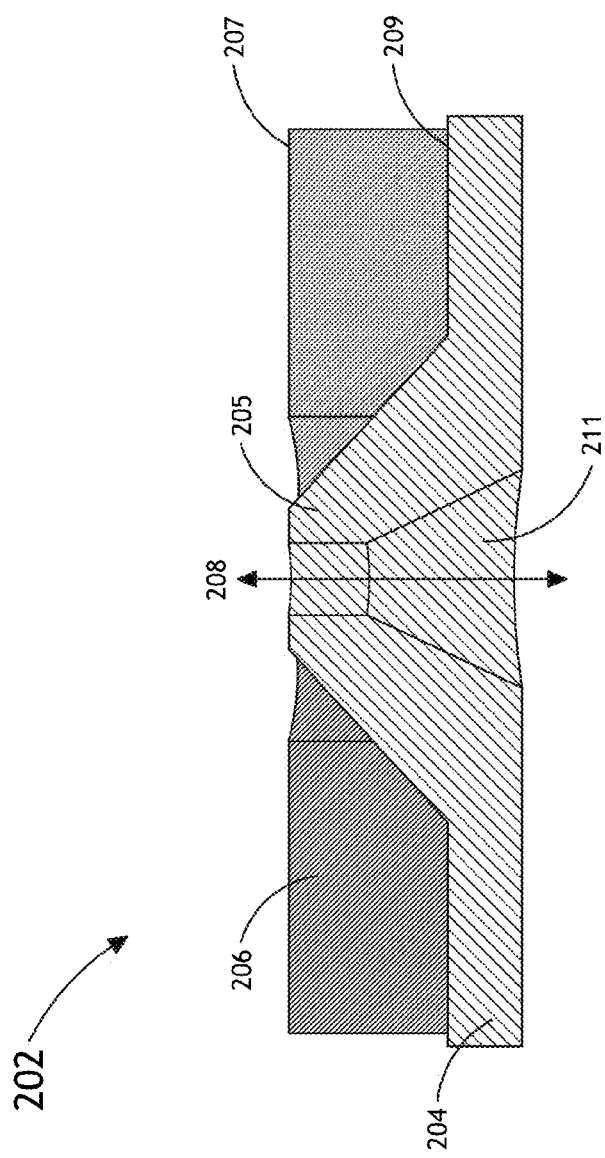
FIG. 2B is an enlarged schematic view of a single snorkel-cone permanent magnetic lens of a snorkel-cone lens array, in accordance with one embodiment of the present invention.
Figure 2C:
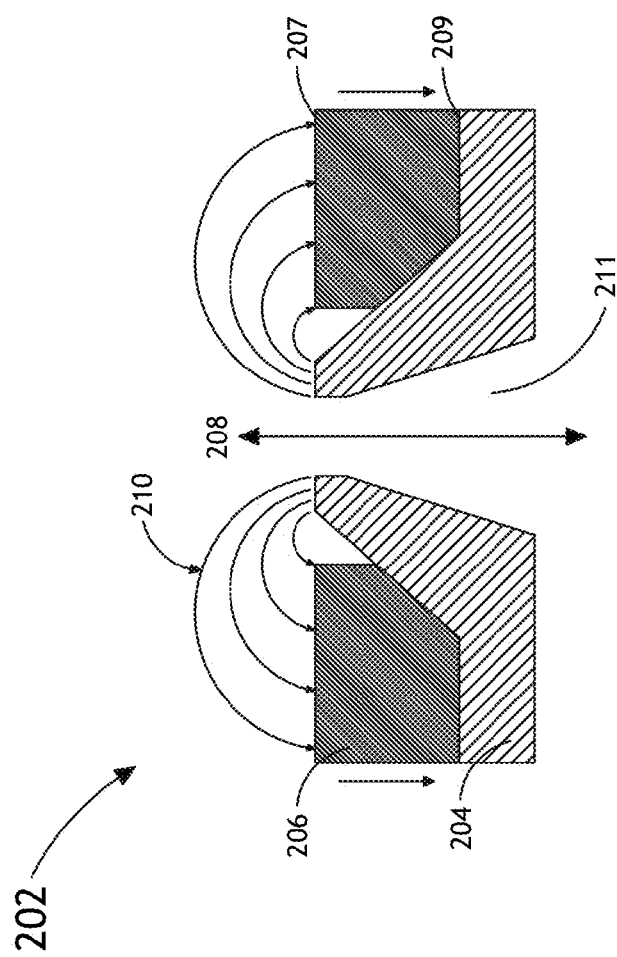
FIG. 2C is an enlarged cross-sectional view of a single snorkel-cone permanent magnetic lens of a snorkel-cone lens array, in accordance with one embodiment of the present invention.

FIGS. 2A through 2F illustrate a schematic view of a snorkel-cone lens array 200 in accordance with an alternative embodiment of the present invention. In one aspect, the snorkel-cone lens array 200 includes a plurality of magnetic lenses 202. Each magnetic lens 202 of the lens array 200 may consist of a snorkel-cone protrusion 205 of a soft magnet sheet 204, a flat base portion of the soft magnetic sheet 204, and an axially symmetric permanent magnet element 206 concentrically arranged about the snorkel-cone protrusion 205, as depicted in FIGS. 2A through 2C.

In a further aspect, the lens array 200 may be formed by operably coupling a plurality of axially symmetrical permanent magnet elements 206 with a sheet of soft magnetic material 204, which includes a plurality of snorkel-cone protrusions 205 extending from the surface of the soft magnetic sheet 204. In this manner, each permanent magnet element 206 may be arranged concentrically about a snorkel-cone protrusion 205 of the soft magnetic sheet 104, forming the snorkel-cone magnetic lenses 202 of the magnetic array 200.

Referring to FIGS. 2A through 2C, the snorkel-cone protrusions 205 extending from the surface of the soft magnetic sheet 204 may have a cone-shape with each protrusion 205 including an opening passing from the top of the protrusion 205 to an opposite side of the sheet of soft magnetic material 204, as illustrated in the magnified cross-sectional view of FIG. 2B. It is recognized herein that the shape of the protrusions 205 are not limited to a cone shape, but may include a number of axially symmetric shapes suitable for producing the magnetic field characteristics required in a given setting.

In some embodiments, the snorkel-cone 205 of each of the magnetic lenses 202 may include a recessed volume which 'flares out' at the base of the snorkel-cone 205. The flared out recession 211 within a given snorkel-cone 205 may act to avoid secondary electrons, which are not as well collimated as the original primary electron beam, from the surface of the sample specimen. It should be further noted that the flared out recession 211 should not significantly disturb the magnetic properties of the given magnetic lens 202 as the removed material does not carry a significant amount of the magnetic flux (even when present).

It is contemplated herein that the magnetic lenses 202 of the snorkel-cone lens array 200 may be utilized as either primary objective lenses or source condenser lenses of an arrayed charged particle-optic system. In one embodiment, a lens 102 of the lens array 100 configured as a condenser lens may require a larger magnetic field than a lens 102 of the lens array 100 configure to operate as an objective lens. As such, the inner and outer radii of a snorkel-cone 205 of a given magnetic lens 202 implemented as a condenser lens may generally be smaller than the inner and outer radii of a snorkel-cone 205 utilized as an objective lens.

It is further recognized, as will be discussed in greater detail further herein, that a pair of magnetic lens array 200 may be utilized simultaneously to form an array of objective lenses and an array of condenser lenses of a column array of an arrayed charged-particle optic system, such as an arrayed SEM system.

As displayed in FIG. 2C, the magnetic field of each of the magnetic lenses 202 of the magnetic lens array 200 may have at least a non-zero net axial component. Each of the permanent magnet elements 206 of the lenses 202 may have a net magnetization that is oriented perpendicular to and directed from the top surface 207 of the permanent magnet element 206 to the bottom surface of the permanent magnet element 209 (or the top surface of the soft magnetic sheet). In this regard, the permanent magnetic element 206 and the soft magnetic material of the sheet 204 and cone 205 may be magnetically coupled. In this manner, the concentric alignment of each of permanent magnetic elements 206 with the snorkel cones 205 of the soft magnetic sheet 204 creates a magnetic field in each of the magnetic lenses 202 having both an axial component and a transverse component.

It should be recognized by those skilled in the art that in this regard the magnetic field lines 210 associated with each magnetic lens 202 of the lens array 200 close locally with respect to each lens 202, as illustrated in FIG. 1C. In contrast to the axial lens array 100 described previously herein, the field lines 210 of each lens 202 of the snorkel-cone lens array 200 extend above the top surface of each of the permanent magnetic elements 206. In this aspect, the snorkel-cone lenses 202 of the lens array 200 may act to immerse the charged particle-optic object or image plane in the magnetic field 210 of a given lens 202. It should further be recognized by those skilled in the art that the immersive effects of the snorkel-cone array 200 are particularly advantageous due to the ability to reduce aberrations and improve charged-particle focusing ability.

In a manner similar to the permanent magnetic sheet 106 described above, the permanent magnetic material of the permanent magnetic elements 206 may include, but is not limited to, a ferromagnetic material, such as a rare-earth magnetic material. It is contemplated herein that the disclosure above related to the material types, magnetization strengths, and thicknesses of the permanent magnetic sheet 106 should be considered to apply to the permanent magnetic elements 206 described herein. As such, the permanent magnetic elements 206 be formed from a NdFeB compound (e.g., $Nd_2Fe_{14}B$) or SmCo compound (e.g., $SmCo_5$).

Referring again to FIGS. 2A through 2C, the permanent magnetic elements 206 may have a 'tile' shape. For examples, as shown in FIG. 2A, each of the permanent magnetic elements 206 may be shaped as square-like tiles. Further, the permanent magnetic elements 206 illustrated in FIG. 2A may consist of square tiles having chamfered corners, which act to reduce chipping and aide in array 200 assembly. Further, it should be recognized that a single tile permanent magnetic element 206 may be used for each snorkel-cone protrusion 205 in order to minimize quality control issues related to fabricating a monolithic piece of high performance permanent magnetic material. As such, by utilizing single permanent magnetic element tiles 206, it is possible to select magnetic tiles having a sufficient level of quality from numerous fabrication batches. Moreover, utilizing single permanent magnetic tiles allow a user to replace broken or defective permanent magnet tiles from a magnetic array 200 after the array has been placed into an operation setting.

It is recognized herein that the permanent magnetic elements 206 may include a variety of sizes and shapes. For instance, large permanent magnetic tiles may be utilized wherein a single permanent magnetic tile overlaps a plurality of snorkel-cone arrays. In a further example, the permanent magnetic tile may consist of an elongated planar tile, which acts to overlap a 'row' of snorkel-cone protrusions 205.

It should be recognized by those skilled in the art that the permanent magnetic elements 206 (e.g., tiles) composed of a neodymium- or samarium-based permanent magnetic material may be fabricated by any suitable sintering process known in the art. Upon sintering the ferromagnetic material into a shape, the ferromagnetic material may be magnetized using a suitable magnetization process using any magnetizer known in the art. Further, upon sintering, the ferromagnetic material may be machined into the required form (e.g., square tile or square tile with chamfered corners). For example, in the case of the array illustrated in FIG. 2A, the sintered pieces of permanent magnetic material may be machined (e.g., ground) into square-like tiles having chamfered corners. Moreover, the openings of the permanent magnetic elements 206, displayed in FIG. 2A, may be created by drilling holes through the volume of the permanent magnetic elements 206 utilizing any suitable drilling equipment known in the art.

In one embodiment, the magnetic array 200 may include a 10 by 10 array of permanent magnetic elements 206. It should be recognized that a 10 by 10 array is not a limitation but merely an illustration of the present invention and that a variety of magnet lens array sizes may be suitable. It is further recognized that additional perimeter permanent magnetic elements 206 may be utilized in order to limit the fringing of magnetic fields associated with the magnetic lenses 202 of the lens array 200. A fringing of magnetic fields within the array may result in a large transverse magnetic field which may lead to blurring (via coma aberration) of the spot size associated with the outer lenses of the array 200. In order to counter this effect, an additional set of array rows may be utilized. For example, an additional row of permanent magnetic elements (lacking an opening 212) may be disposed along each edge of a 10 by 10 magnetic lens array 200. In this regard, a 12 by 12 array of permanent magnetic elements 206 may be utilized in a given array 200, wherein the outer most rows of permanent magnetic elements 206 consist of fringing correction elements are not associated with an underlying snorkel-cone protrusion 205.

Figure 2D:
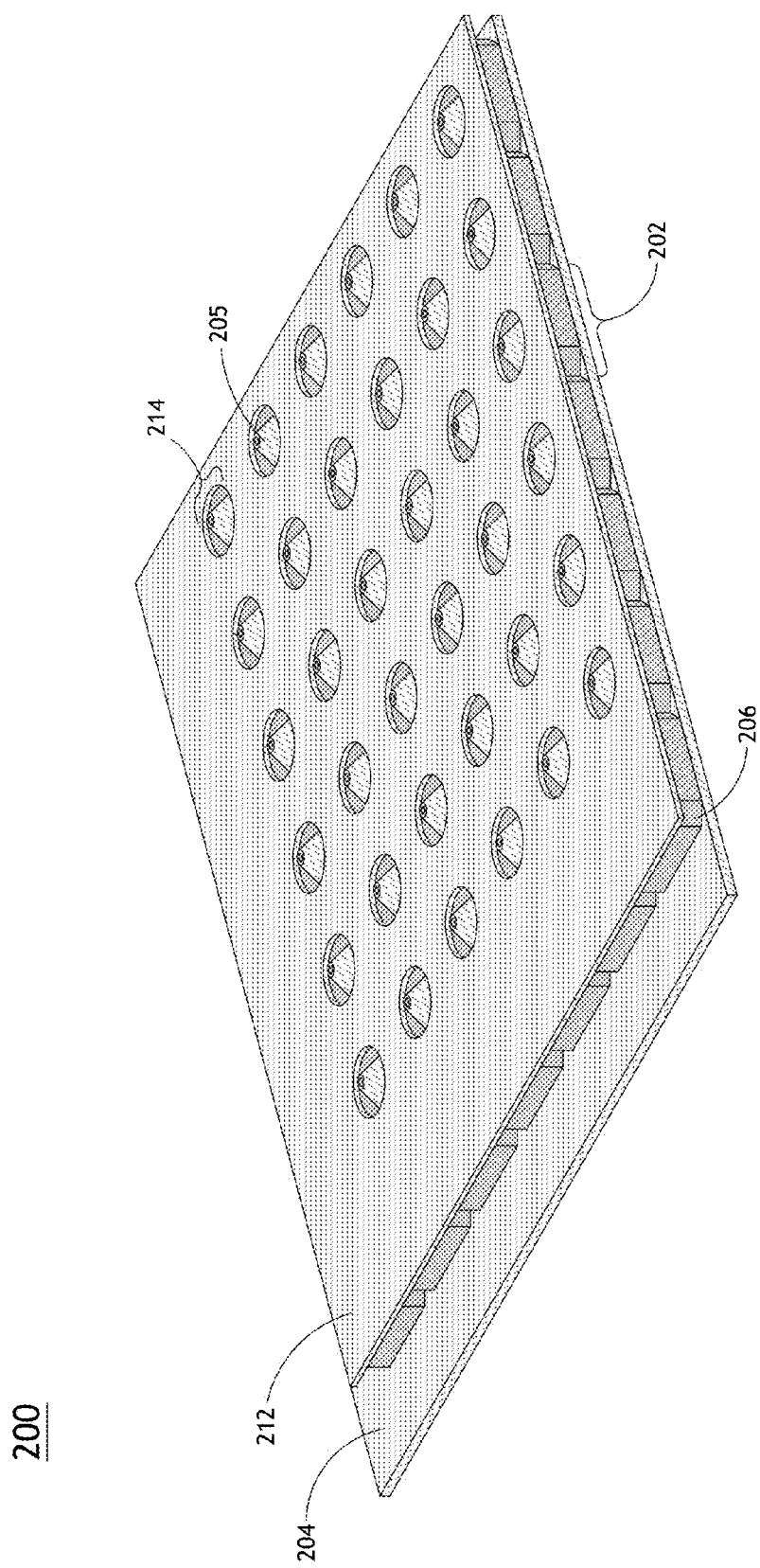
FIG. 2D is a schematic view of a permanent magnetic snorkel-cone lens array equipped with an additional top soft magnetic sheet, in accordance with one embodiment of the present invention.
Figure 2E:
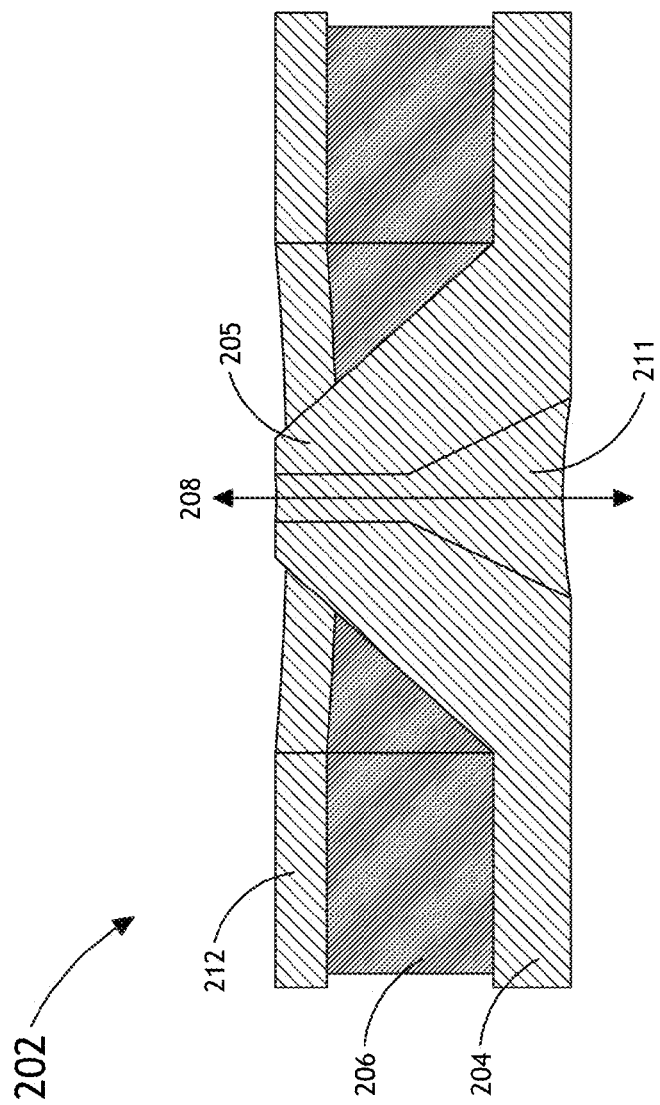
FIG. 2E is an enlarged cross-sectional view of a single snorkel-cone permanent magnetic lens of a snorkel-cone lens array equipped with an additional top soft magnetic sheet, in accordance with one embodiment of the present invention.
Figure 2F:
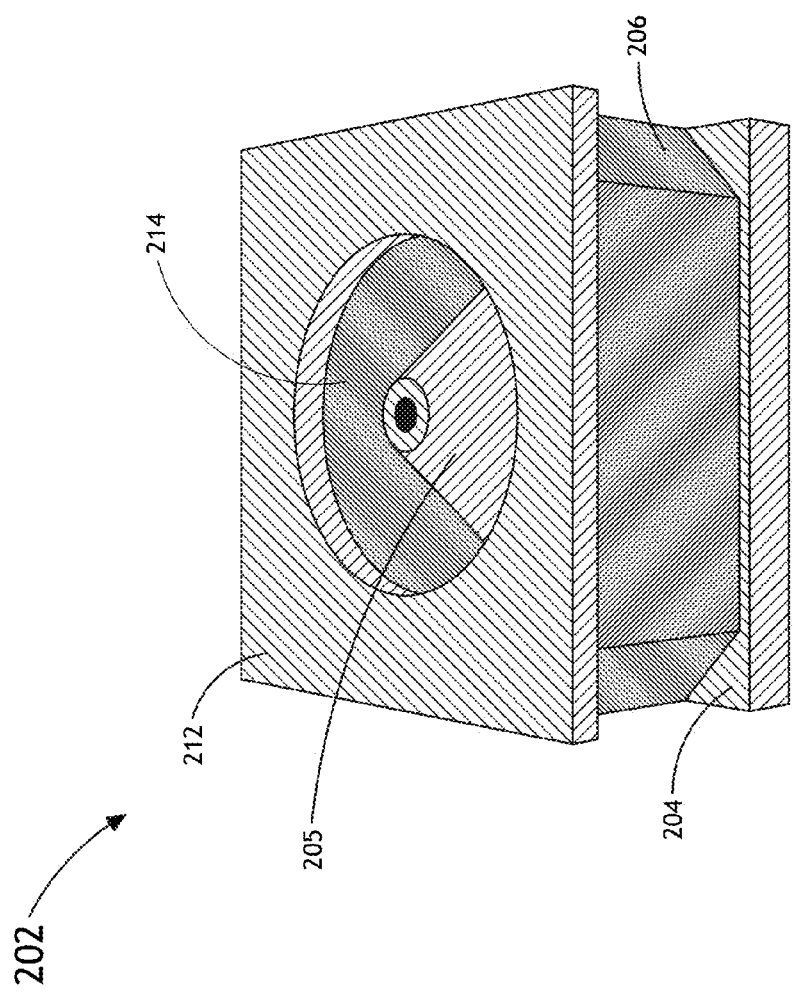
FIG. 2F is an enlarged schematic view of a single snorkel-cone permanent magnetic lens of a snorkel-cone lens array equipped with an additional top soft magnetic sheet, in accordance with one embodiment of the present invention.

Referring now to FIGS. 2D through 2F, the snorkel-cone lens array 200 may include an additional top sheet of soft magnetic material operably coupled to the top surface of the plurality of permanent magnet elements 206. For example, a second sheet of soft magnetic material 212 having a plurality of openings 214 may be attached to the top surfaces of the permanent magnetic elements 206 of the array 200. In this regard, each of the openings 214 of the second soft magnetic sheet 212 may be aligned concentrically with the underlying snorkel-cone protrusions 205 of the first soft magnetic sheet

204. Applicants note that utilization of a second sheet 212 may aid in minimizing the sensitivity of the lens array 200 to the variation in magnetization strength and orientation of the various individual permanent magnetic elements 206. For example, the Applicants have found that in the absence of a second sheet 212 a small error in magnetization orientation of a given permanent magnetic element 206 may introduce a transverse field above the associated snorkel-cone lens 202. A deviation such as this may lead to a deflection of an incident electron beam causing coma aberration. The addition of a second sheet 212 may aid in avoiding the above described sensitivity almost entirely, wherein larger magnetization orientation errors introduce no appreciable aberration at the snorkel-cone lens 202. It should be recognized that the utilization of the top sheet 212 may be particularly advantageous as the permanent magnetic materials known in the art often display significant orientation and magnitude variations.

It is further noted that the second soft magnetic material sheet 212 may be fabricate utilizing the same material and material processes of the first soft magnetic material sheet 204. For example, the second sheet 212 may include a sheet of magnetic steel, such as, but not limited to, an iron-cobalt based soft magnetic material (e.g., hiperco50A).

Figure 3:
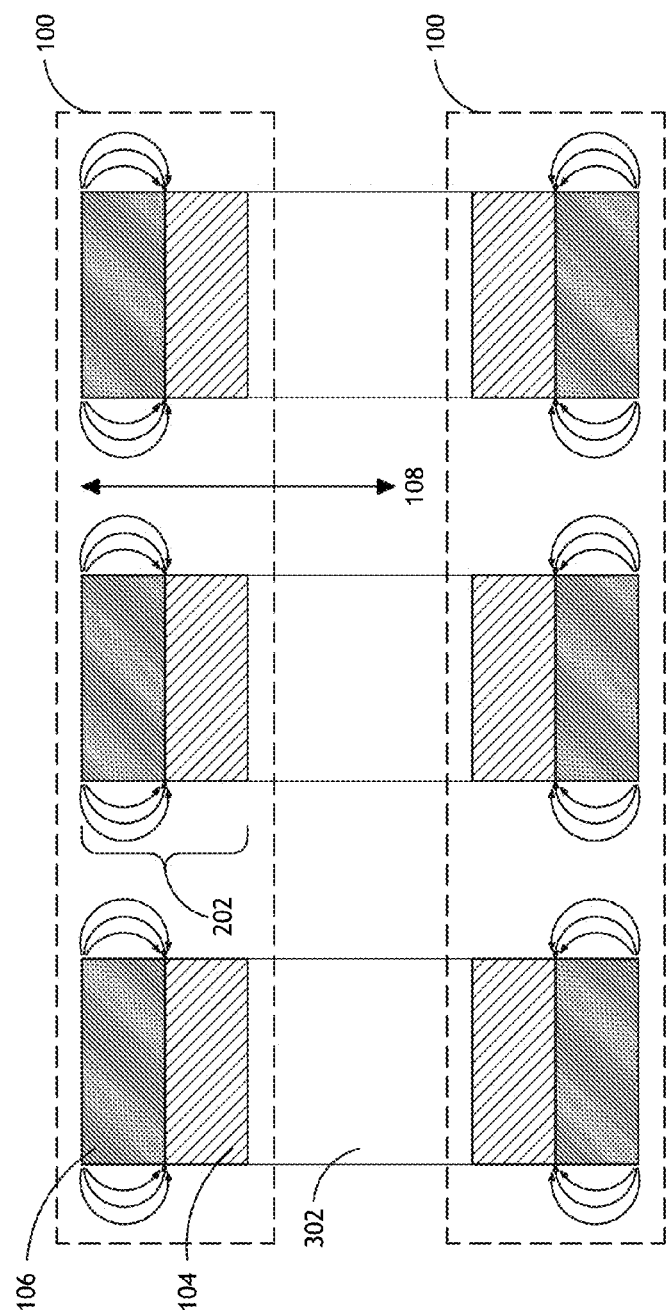
FIG. 3 is a cross-sectional view of a pair of simultaneously implemented permanent magnetic axial lens arrays, in accordance with one embodiment of the present invention.
Figure 4:
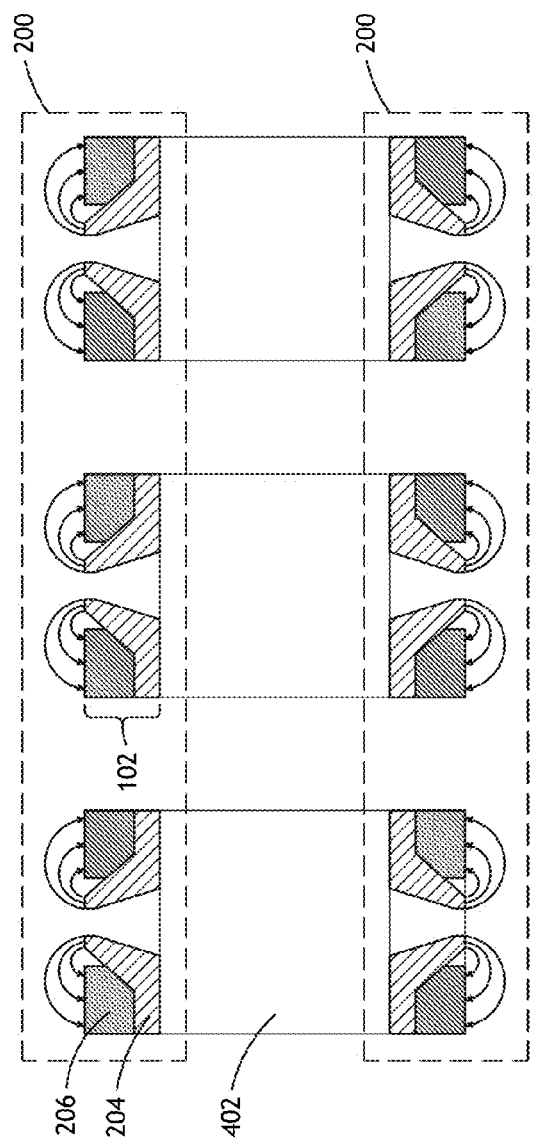
FIG. 4 is a cross-sectional view of a pair of simultaneously implemented permanent magnetic snorkel-cone lens arrays, in accordance with one embodiment of the present invention.

FIGS. 3 and 4 illustrate cross-sectional views of a pair of magnetic lens arrays (e.g., 100 or 200) implemented simultaneously in a charged-particle optics system. Referring now to FIG. 3, a pair of axial lens arrays 100 are combined to form a column array 300 suitable for implementation in a charged-particle optics system, such as an arrayed SEM. In one aspect, the column array 300 may include a first axial lens array 100 and a second axial lens array. In one embodiment, the first and second lens arrays 100 may be configured to operate as a source condenser lens and a primary objective lens, respectively. In this regard, a magnetic lens 102 of the top axial lens array 100 may act to condense a charged-particle beam prior to the charged-particle beam passing through various electrostatic elements 302 (e.g., deflectors, trim lenses, detectors, and the like). After the charged particle beam passes the various electrostatic elements 302, a magnetic lens 102 of the bottom magnetic lens array 100 may act to focus the charged-particle beam onto the surface of a sample.

The locally closed loop permanent magnetic lenses 102 of the lens array 100 are particularly advantageous in the context described above as no magnetic flux bypass is required to bypass magnetic flux around the various electrostatic elements 302 of the column array 300. Moreover, the absence of magnetic flux bypass components allows for increased operation space within the electrostatic layers, reduces the risk of electrostatic arching, and simplifies manufacture.

Moreover, as discussed previously herein the lenses of the objective array 100 (i.e., bottom array) may require a lower field than that of the condenser array 100 (i.e., top array). In this regard, the magnetic fields of the magnetic lenses of the two magnetic arrays 100 may be tailored in any manner known in the art. For example, the permanent magnetic material of the condenser array 100 may consist of a material having a larger magnetization than that of the objective array 100. In another example, the thickness of the condenser array 100 may be increased relative to the objective array 100 in order to increase the overall amount of magnet energy present at the magnetic lenses 102 of the condenser array 100.

Referring now to FIG. 4, similarly to FIG. 3 described above, a pair of snorkel-cone lens arrays 100 may be combined to form a column array 400 suitable for implementation in a charged-particle optics system. In one aspect, the column array 400 may include a first snorkel-cone lens array 200 and a second snorkel-cone lens array 200. In one embodiment, the first and second lens arrays 200 may be configured to operate as a source condenser lens and a primary objective lens, respectively. In this regard, a magnetic lens 202 of the top axial lens array 200 may act to condense a charged-particle beam prior to the charged-particle beam passing through various electrostatic elements 402. After the charged particle beam passes the various electrostatic elements 402, a magnetic lens 202 of the bottom magnetic lens array 200 may act to focus the charged-particle beam onto the surface of a sample.

Further, as discussed previously herein, the lenses of the objective permanent magnet array 200 (i.e., bottom array) may be configured to have a lower field than the lenses of an associated permanent magnet condenser array 200 (i.e., top array). In this regard, the magnetic fields of the magnetic lenses of the two snorkel-cone magnetic arrays 200 may be tailored in any manner known in the art. For example, the relative size of the inner and outer radii of the objective lenses of the objective lens array and the condenser lenses of the condenser lens array may be adjusted as required by the specific context of implementation.

Figure 5A:
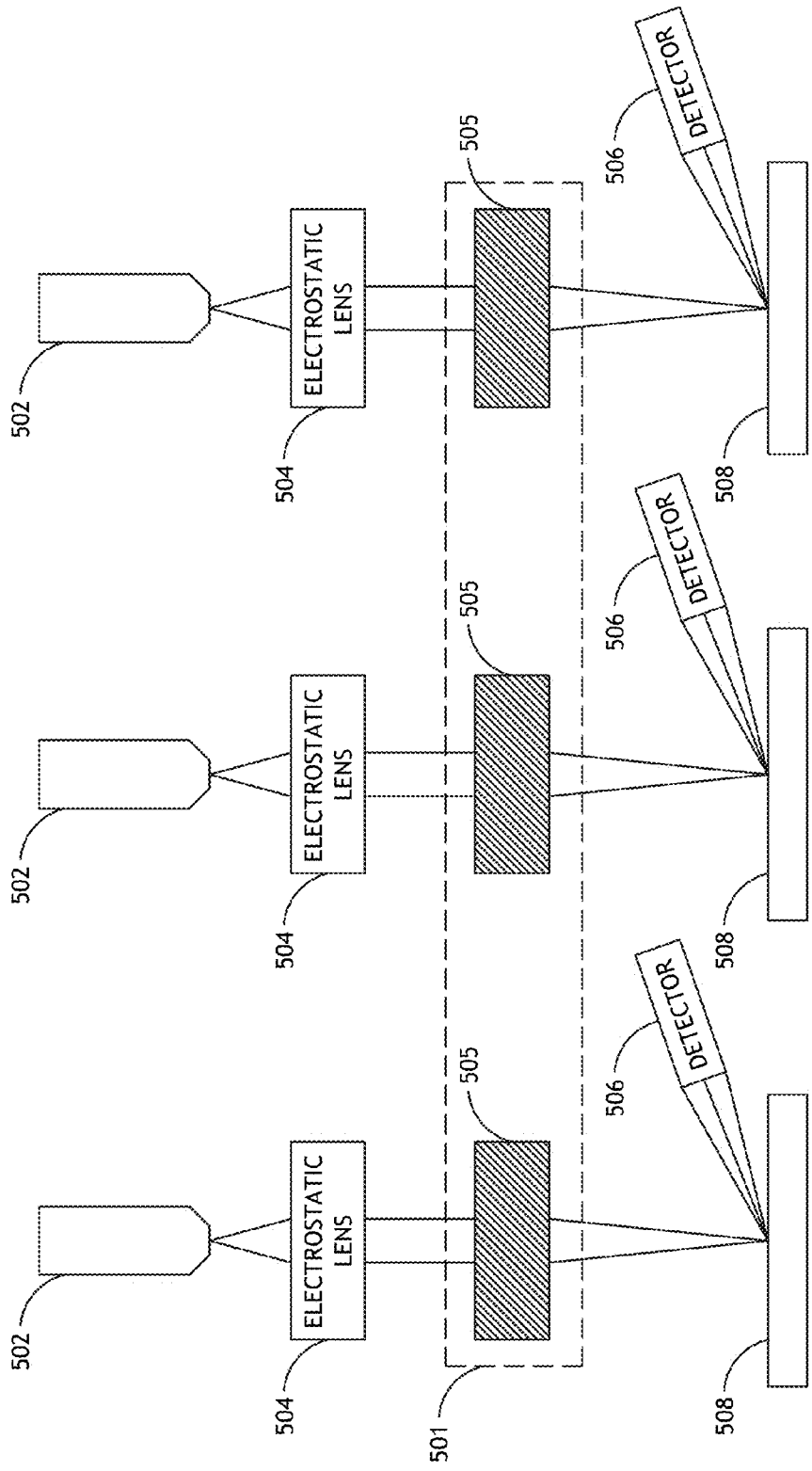
FIG. 5A is a block diagram of a permanent magnet lens array operating in conjunction with a electrostatic lenses in a column array of a charged-particle optics system.
Figure 5B:
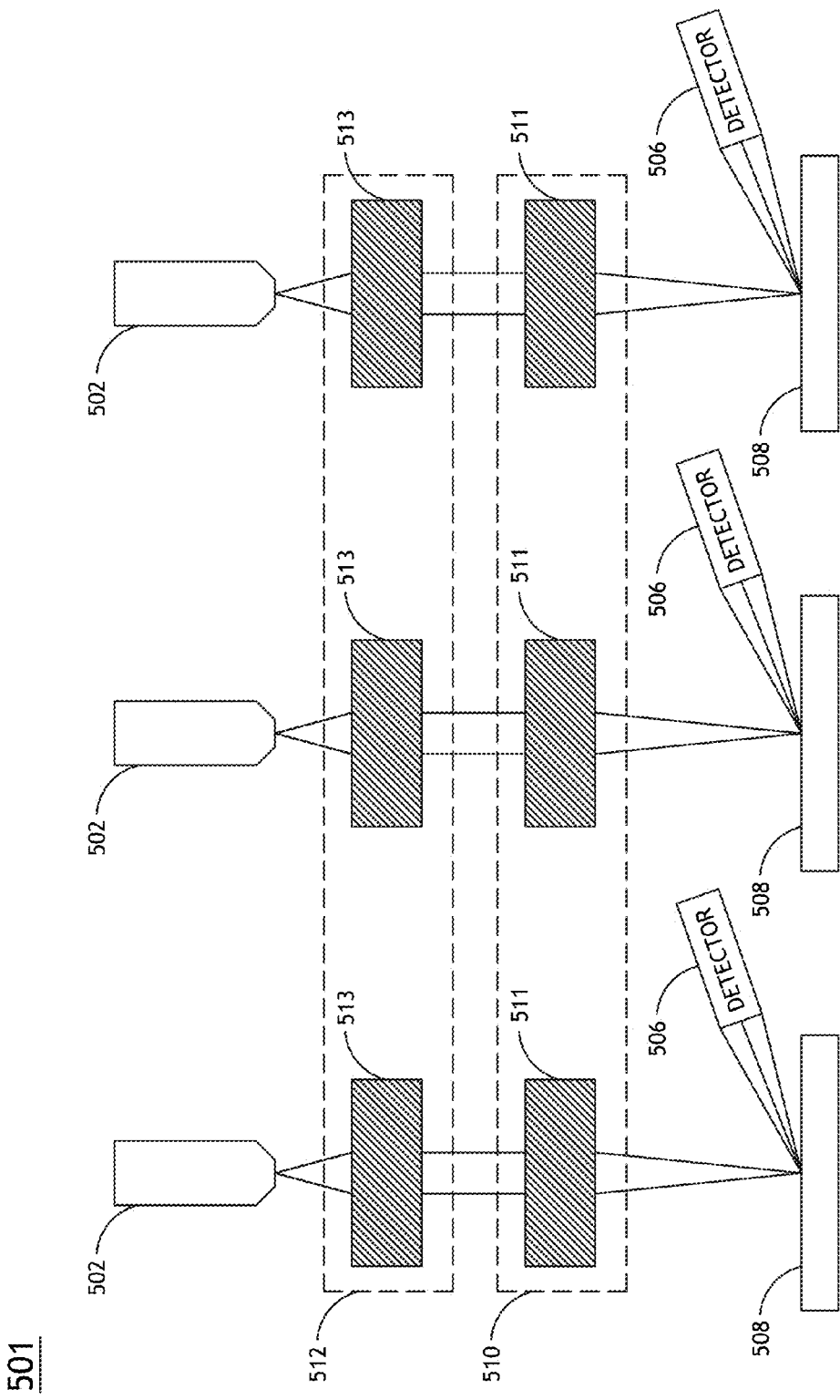
FIG. 5B is a block diagram of a pair of permanent magnet lens arrays operating in conjunction with one another in a column array of a charged-particle optics system.

FIGS. 5A and 5B illustrate block diagrams of charged-particle optics systems 500 and 501 implementing one or more permanent magnetic arrays of the present invention. Referring now to FIG. 5A, a block diagram of an arrayed charged-particle optics system 500 implementing a single permanent magnetic array 501 in conjunction with a plurality of electrostatic lenses 504 is illustrated. The system 500 may include, but is not limited to, one or more charged-particle sources 502 (e.g., an electron source), a plurality of electrostatic lenses 504, an array of permanent magnet lenses 501 including a plurality of permanent magnet based lenses 505, and a detector 506 configured to detect secondary electrons emanating from the surface of a specimen 508. It should be recognized that any charged-particle source and detector known in the art may be suitable for implementation in the present invention and the specific choice of these devices will be obvious to those skilled in the art based on the specific context of implementation. Moreover, while FIGS. 5A and 5B depict multiple charged-particle sources it is recognized that a single charged-particle source may be used. In this manner, the multiple 'sources' as depicted in FIGS. 5A and 5B should merely be interpreted as multiple charged-particle pathways into the column array of the charged-particle systems 500 and 501. Similarly, the multiple detectors 506 depicted in FIGS. 5A and 5B should merely be interpreted as multiple detection points of secondary electrons emanating from the specimen 508, which may be carried out with a single charged-particle detection device.

In one embodiment, shown in FIG. 5A, the electrostatic lenses 504 may be arranged to operate as source condenser lenses, while the permanent magnet lenses 505 of the permanent magnet array 501 may be arranged to function as the primary objectives of the columns of the arrayed charged-particle optics system 500.

Referring now to FIG. 5B, a block diagram of an arrayed charged-particle optics system 501 implementing a pair of permanent magnetic arrays 510 and 512 is illustrated. The system 501 may include, but is not limited to, one or more charged-particle sources 502 (e.g., an electron source), a first array of permanent magnetic lenses 510 including a first plurality of permanent magnet based lenses 511, a second array of permanent magnet lenses 512 including a second plurality of permanent magnet based lenses 513, and a detector 506 configured to detect secondary electrons emanating from the surface of a specimen 508. In one embodiment, shown in FIG. 5B, the lenses 511 of the first permanent magnet lens array may be arranged to operate as primary objective lenses of the column array, while the permanent magnet lenses 513 of the second permanent magnet array 512 may be arranged to function as source condensers of the columns of the charged-particle optics system 501.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

Furthermore, it is to be understood that the invention is defined by the appended claims.

What is claimed:

1. A permanent magnetic lens array for charged-particle focusing, comprising:
    a planar volume of a permanent magnetic material, wherein the planar volume of permanent magnetic material includes a plurality of lens openings distributed across a surface of the planar volume of the permanent magnetic material, wherein each of the lens openings of the planar volume of the permanent magnetic material is axially symmetrical and passes from a first surface to a second surface of the planar volume of permanent magnetic material; and
    a planar volume of a soft magnetic material, wherein the planar volume of soft magnetic material includes a plurality of lens openings distributed across a surface of the planar volume of the soft magnetic material, wherein each lens opening of the planar volume of soft magnetic material is axially symmetrical and passes from a first surface to a second surface of the planar volume of soft magnetic material, wherein the planar volume of soft magnetic material is operably coupled to a surface of the planar volume of the permanent magnetic material such that at least a portion of the lens openings of the planar volume of permanent magnetic material are substantially aligned with at least a portion of the lens openings of the planar volume of soft magnetic material, wherein the planar volume of permanent magnetic material and the planar volume of soft magnetic material are arranged in a substantially planar monolithic structure, wherein the plurality of lens openings of the volume of permanent magnetic material and the plurality of lens openings of the volume of soft magnetic material are configured to form a plurality of magnetic lenses, wherein each magnetic lens has a magnetic field with at least an axial component oriented substantially perpendicular to the first surface of the planar volume of the permanent magnetic material.

2. The magnetic lens array of claim 1, further comprising:
    an additional planar volume of a soft magnetic material, wherein the additional planar volume of soft magnetic material includes a plurality of lens openings distributed across a surface of the additional planar volume of the soft magnetic material, wherein each lens opening of the additional planar volume of soft magnetic material is axially symmetrical and passes from a first surface to a second surface of the additional planar volume of soft magnetic material, wherein the additional planar volume of soft magnetic material is operably coupled to a second surface of the planar volume of the permanent magnetic material such that at least a portion of the lens openings of the planar volume of permanent magnetic material are substantially aligned with at least a portion of the lens openings of the planar volume of soft magnetic material and the additional planar volume of soft magnetic material, wherein the planar volume of permanent magnetic material, the planar volume of soft magnetic material, and the planar volume of soft magnetic material are arranged in a substantially planar monolithic structure, wherein the plurality of lens openings of the planar volume of permanent magnetic material, the plurality of lens openings of the planar volume of soft magnetic material, and the plurality of lens openings of the additional planar volume of soft magnetic material are configured to form a plurality of magnetic lenses, wherein each magnetic lens has a magnetic field with at least an axial component.

3. The magnetic lens array of claim 1, wherein the planar volume of permanent magnetic material has a permanent magnetization oriented substantially perpendicular to and directed towards the first surface of the planar volume of permanent magnetic material.

4. The magnetic lens array of claim 1, wherein the magnetic field of each of the magnetic lenses is substantially constrained within the planar volume of permanent magnetic material.

5. The magnetic lens array of claim 1, wherein some of the plurality of lens openings of the volume of the permanent magnetic material or the volume of the soft magnetic material are cylindrically shaped.

6. The magnetic lens array of claim 1, wherein the volume of the permanent magnetic material comprises:
a volume of rare-earth permanent magnetic material.

7. The magnetic lens array of claim 1, wherein the volume of the soft magnetic material comprises:
a volume of magnetic steel.

8. The magnetic lens array of claim 1, wherein the plurality of magnetic lenses are configured as at least one of a plurality of primary objective lenses or a plurality of condenser lenses.

9. A permanent magnetic lens array for charged-particle focusing, comprising:
a first sheet of soft magnetic material, wherein the first sheet of soft magnetic material includes a plurality of snorkel cones, each snorkel cone protruding from a first surface of the soft magnetic material, wherein the plurality of snorkel cones are arranged in an array pattern, wherein each snorkel cone is axially symmetric and includes an opening passing from the first surface of the first sheet of soft magnetic material to a second surface of soft magnetic material; and
a plurality of permanent magnetic elements, wherein each permanent magnetic element is axially symmetric and arranged concentrically with a snorkel cone of the first sheet of soft magnetic material, wherein each of the permanent magnetic elements are operably coupled to the first surface of the first sheet of soft magnetic material, wherein the plurality of snorkel cones of the first sheet of soft magnetic material and the plurality of permanent magnetic elements are configured to form a plurality of magnetic lenses, wherein each magnetic lens has a magnetic field with at least an axial component oriented substantially perpendicular to the first surface of the soft magnetic material.

10. The magnetic lens array of claim 9, wherein the plurality of permanent magnetic elements comprise:
a plurality of permanent magnetic tiles.

11. The magnetic lens array of claim 9, wherein at least some of the permanent magnetic elements have a permanent magnetization oriented substantially perpendicular to and directed towards the first surface of the planar volume of soft magnetic material.

12. The magnetic lens array of claim 9, wherein a portion of the magnetic field of each of the magnetic lenses extends beyond an upper most portion of one or more of the snorkel cone protrusions.

13. The magnetic lens array of claim 9, wherein each of the permanent magnetic elements comprises:
a rare-earth permanent magnetic element.

14. The magnetic lens array of claim 9, wherein the first sheet of soft magnetic material comprises:
a sheet of magnetic steel.

15. The magnetic lens array of claim 9, wherein the plurality of magnetic lenses are configured as at least one of a plurality of primary objective lenses or a plurality of condenser lenses.

16. The magnetic lens array of claim 9, further comprising:
a second sheet of soft magnetic material operably coupled to a first surface of at least some of the permanent magnetic elements, wherein the second sheet of soft magnetic material includes a plurality of openings.

17. An apparatus for focusing one or more charged-particle beams, comprising:
at least one charged-particle source;
a charged-particle optic system including at least one permanent magnetic lens array, wherein the permanent magnetic lens array further comprises:
at least a first sheet of soft magnetic material including a plurality of lens openings;
a plurality of permanent magnetic elements operably coupled to the at least a first sheet of soft magnetic material,
wherein the plurality of permanent magnetic elements and the plurality of lens openings of the at least a first sheet of soft magnetic material are configured to form a plurality of magnetic lenses distributed in an array, each magnetic lens configured to focus a charged-particle beam emitted from the at least one charged-particle source, wherein each of the magnetic lenses is axially symmetrical; and
at least one detector configured to detect secondary electrons emitted from a surface of a specimen.

18. The apparatus of claim 17, wherein the permanent magnetic lens array comprises at least one of an axial magnetic lens array or a snorkel-cone magnetic lens array.

19. The apparatus of claim 17, wherein the at least one charge-particle source comprises:
at least one electron source.

20. The apparatus of claim 17, wherein the at least one charge-particle source comprises:
two or more charged-particle sources.

21. The apparatus of claim 17, wherein each of the magnetic lenses of the permanent magnetic lens array is configured as at least one of a source condenser lens or a primary objective lens.

22. The apparatus of claim 17, further comprising:
at least one additional permanent magnetic lens array including at least one additional plurality of magnetic lenses, wherein each magnetic lens is configured as at least one of a source condenser lens or a primary objective lens.

23. The apparatus of claim 17, further comprising:
a plurality of electrostatic lenses, wherein each electrostatic lens is configured as at least one of a source condenser lens or a primary objective lens.

* * * * *